United States Patent
Manalac et al.

(10) Patent No.: US 7,109,570 B2
(45) Date of Patent: Sep. 19, 2006

(54) INTEGRATED CIRCUIT PACKAGE WITH LEADFRAME ENHANCEMENT AND METHOD OF MANUFACTURING THE SAME

(75) Inventors: Rodel Manalac, Singapore (SG); Hien Boon Tan, Singapore (SG); Francis Poh, Singapore (SG); Jaime Siat, Singapore (SG); Roland Cordero, Singapore (SG)

(73) Assignee: United Test and Assembly Test Center Ltd., Singapore (SG)

( * ) Notice: Subject to any disclaimer, the term of this patent is extended or adjusted under 35 U.S.C. 154(b) by 0 days.

(21) Appl. No.: 10/812,058

(22) Filed: Mar. 30, 2004

(65) Prior Publication Data
US 2005/0051876 A1    Mar. 10, 2005

Related U.S. Application Data

(60) Provisional application No. 60/500,696, filed on Sep. 8, 2003.

(51) Int. Cl.
*H01L 23/495* (2006.01)

(52) U.S. Cl. .................. 257/666; 257/670; 257/787
(58) Field of Classification Search ................ 257/666, 257/667, 670, 672, 676, 787
See application file for complete search history.

(56) References Cited

U.S. PATENT DOCUMENTS

| 6,197,615 B1 * | 3/2001 | Song et al. | 438/111 |
| 6,841,854 B1 * | 1/2005 | Itou et al. | 257/666 |

* cited by examiner

*Primary Examiner*—Hoai Pham
(74) *Attorney, Agent, or Firm*—Sughrue Mion, PLLC

(57) ABSTRACT

An integrated circuit package having a die pad and a plurality of leads is disclosed. At least one of the plurality of leads has a recess formed in a first face thereof. The package also has an integrated circuit chip coupled to the die pad through an adhesive layer. A plurality of wires each link a first face of the integrated circuit chip to one of the plurality of leads. An encapsulant encloses the integrated circuit chip, the plurality of wires, the die pad, and a portion of each of the plurality of leads. The encapsulant forms a plurality of side walls which slant downward and outward. At least one of the side walls intersects with the first face of the at least one lead within the side walls of the recess formed therein.

6 Claims, 6 Drawing Sheets

Figures 3A-C
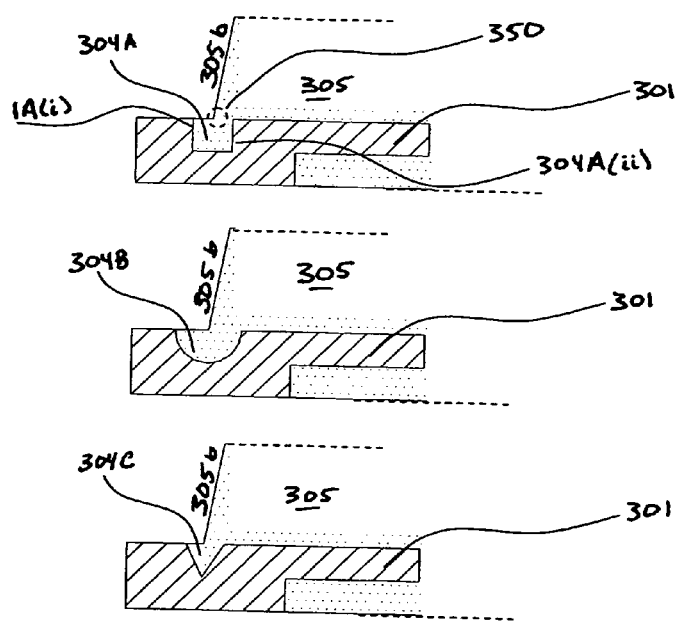
Figures 4A-C
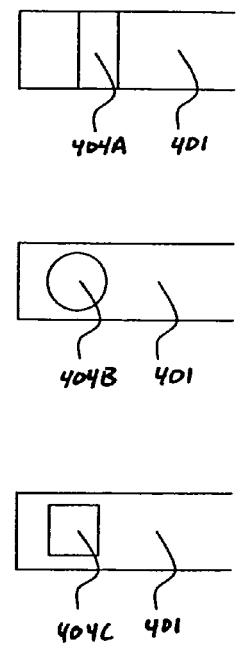

Figures 7A-E
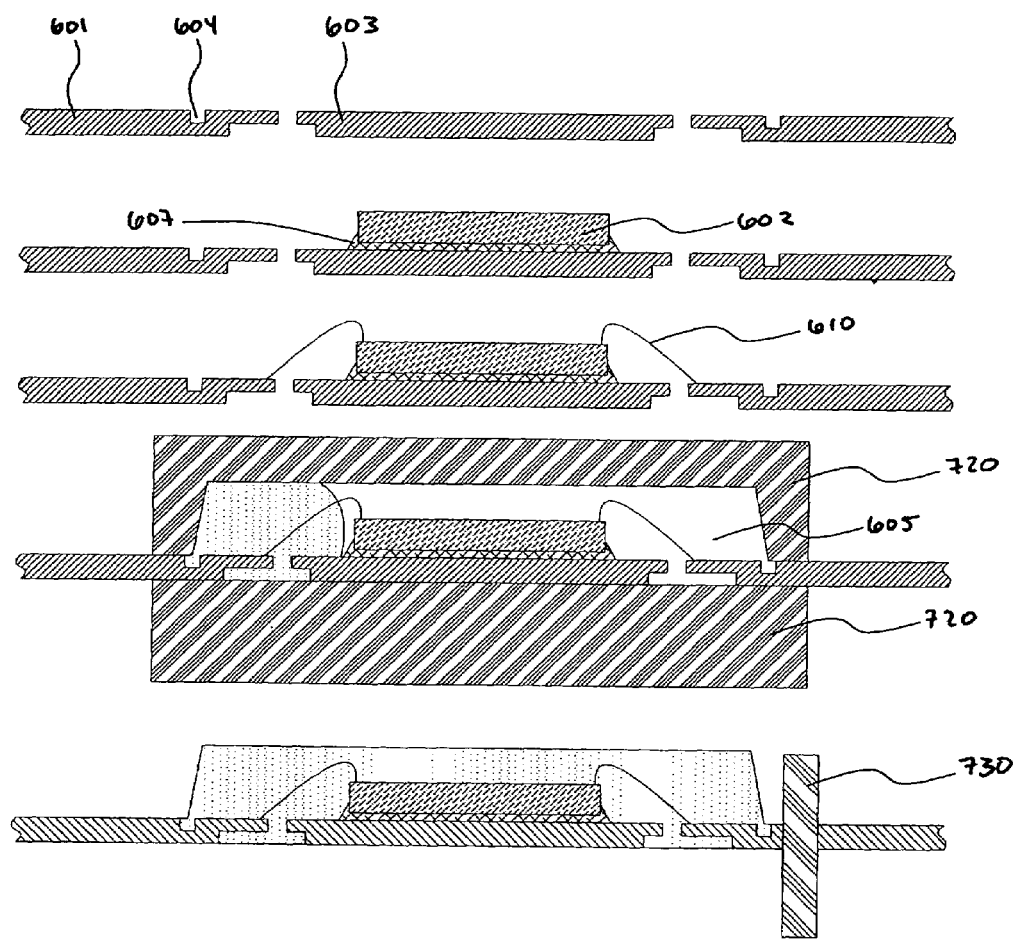

INTEGRATED CIRCUIT PACKAGE WITH LEADFRAME ENHANCEMENT AND METHOD OF MANUFACTURING THE SAME

This application claims the benefit of the co-pending U.S. Provisional Application No. 60/500,696, filed on Sep. 8, 2003, and incorporated herein by reference. This application is related to the technology of co-pending USPTO application Ser. No. 10/721,382.

BACKGROUND OF THE INVENTION

1. Field of the Invention

The present invention generally relates to the field of semiconductor integrated circuit (IC) packaging. In particular, the present invention relates to an integrated circuit package with a leadframe enhancement and a method of assembling the same in order to provide high package stability.

2. Discussion of Related Art

Semiconductors are materials that have characteristics of both insulators and conductors. In today's technology, semiconductor materials have become extremely important as the basis for transistors, diodes, and other solid-state devices. Semiconductors are usually made from germanium or silicon, but selenium and copper oxide, as well as other materials, are also used. When properly made, semiconductors will conduct electricity in one direction better than they will in the other direction.

Semiconductor devices and ICs are made up of components, such as transistors and diodes, and elements such as resistors and capacitors, linked together by conductive connections to form one or more functional circuits. Interconnects on an IC chip serve the same function as the wiring in a conventional circuit.

Once the components of an IC package have been assembled, the package is typically sealed by plastic encapsulant in order to improve the strength of the package and to provide necessary protection to components within.

U.S. Pat. No. 5,894,108 to Mostafazadeh discloses a typical encapsulated IC package. IC package 100, illustrated in FIGS. 1A and 1B, is one example of a typical IC package. The package 100 comprises a die pad 103, a plurality of leads 101, and an IC chip 102 mounted to the die pad through an adhesive layer 107. The IC chip 102 is electrically joined to the plurality of leads 101 through a plurality of wires 110. The entire package is protected by an encapsulant 105, which hardens to protect the elements within and to add support to the package as a whole.

A problem associated with IC packages encapsulated in the conventional way, such as IC package 100 of FIGS. 1A and 1B, is the separation of the hardened encapsulant 105 from the leads 101 at regions of high stress. As shown in FIG. 1B, when the components of the package 100 are subjected to the mechanical and thermal stresses of normal use, the hardened encapsulant 105 may separate from the leads 101 at points of high stress, such as point 106. These separations increase over time and can effect the functioning and quality of the package as a whole.

SUMMARY OF THE INVENTION

A IC package according to the present invention solves the above-described problem of conventional package encapsulation by providing an enhanced leadframe which permits the encapsulant to become embedded in and locked to the frame.

A leadframe for an IC package according to a first exemplary embodiment of the present invention comprises an outer frame, a die pad portion disposed within the outer frame, a plurality of lead portions, and a plurality of tie bars connecting the die pad portion to the outer frame. The lead portions extend substantially inward from the outer frame towards the die pad portion. At least one of the plurality of lead portions has a recess formed therein. The recess can comprise a channel formed through each of the lead portions from one side to the opposite side. Alternately, the recess can comprise a dimple-shaped impression.

According to one aspect of the first exemplary embodiment of the present invention, at least one of the tie bars also has a recess formed therein. The recess can comprise a channel or it can comprise a dimple-shaped impression.

An IC package according to a second exemplary embodiment of the present invention comprises a die pad, having a first face and a second face opposite to the first face, and a plurality of leads, each having a first face and a second face opposite to the first face. Hereinafter, the terms "first" and "second" are merely used for convenience and do not reflect the order of formation, placement, or observation. The leads are disposed substantially around at least a portion of the die pad. The first face of at least one of the leads has a recess with inner walls formed therein. The package also comprises an IC chip with a first face and a second face opposite to the first face. The second face of the IC chip is coupled to the first face of the die pad. The package also comprises a plurality of wires linking the IC chip to one of the plurality of leads. An encapsulant encloses the IC chip, the plurality of wires, the first face of the die pad, and a portion of the first faces of the leads. The encapsulant forms a plurality of side walls. At least one of the side walls intersects the first face of at least one of the leads between the inner walls of the recess formed therein. The encapsulant can fill the recess.

According to one aspect of the second exemplary embodiment of the present invention, the recess can comprise a channel or can comprise a dimple-shaped impression.

A method of assembling an IC package according to a third exemplary embodiment of the present invention comprises providing a die pad, having a first face and a second face opposite to the first face; a plurality of leads, each having a first face and a second face opposite to the first face; and an IC chip having a first face and a second face opposite to the first face. The first face of at least one of the plurality of leads has a recess with inner walls formed therein. The method also comprises coupling the second face of the IC chip to the first face of the die pad and electrically connecting the IC chip to the plurality of leads. The method further comprises enclosing the IC chip, the first face of the die pad, and a portion of the first face of the plurality of leads with an encapsulant. The encapsulant forms a plurality of side walls, at least one of which intersects with the first face of the at least one lead between the inner walls of the recess formed therein.

According to one aspect of the third exemplary embodiment of the present invention, the recess formed in the first face of each of the leads can comprise a channel or can comprise a dimple-shaped impression.

BRIEF DESCRIPTION OF THE DRAWINGS

These and other features, aspects, and advantages of the present invention will become better understood with reference to the following description, amended claims, and accompanying drawings, which should not be read to limit the invention in any way, in which:

FIGS. 3A–C are enlarged cross-sections of leads according to exemplary aspects of the present invention.

FIGS. 4A–C are enlarged plane views of leads according to exemplary aspects of the present invention.

FIGS. 7A–E are cross sections illustrating a method of assembling an IC package according to an exemplary embodiment of the present invention.

DETAILED DESCRIPTION OF THE INVENTION

The present invention will be explained in further detail with reference to the accompanying drawings.

Figure 1A:
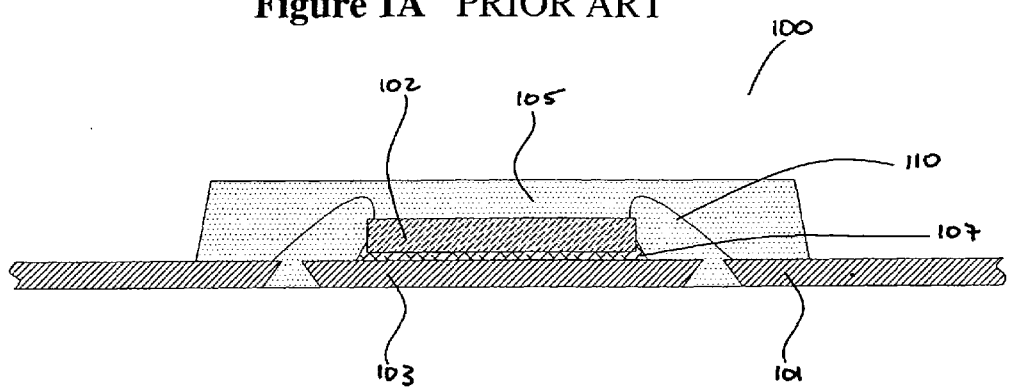
FIGS. 1A–B are a cross-sections of a conventional IC package.
Figure 1B:
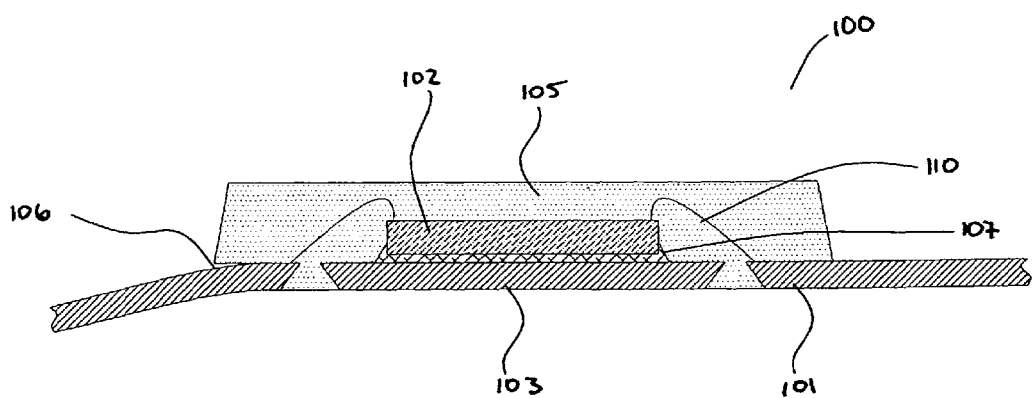
Figure 2A:
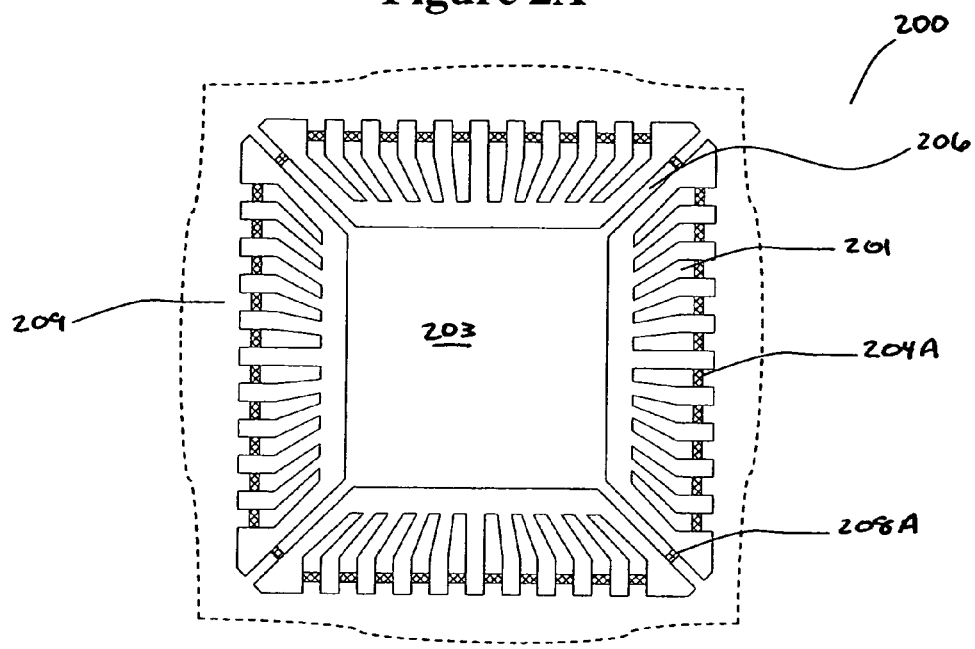
FIGS. 2A–B are a plane views of leadframes according to an exemplary embodiment of the present invention.
Figure 2B:
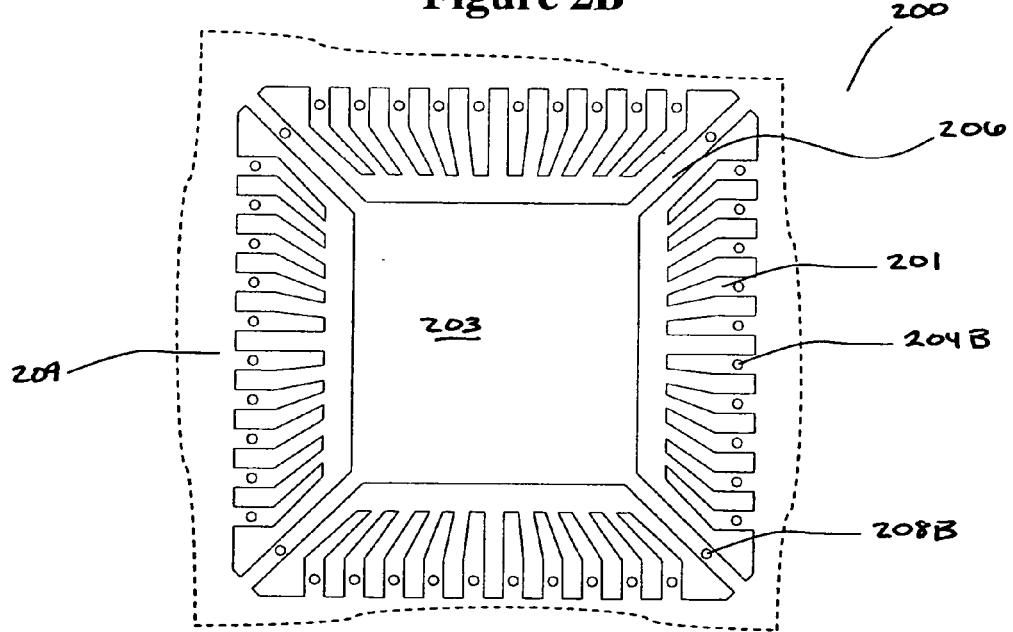
Figure 5:
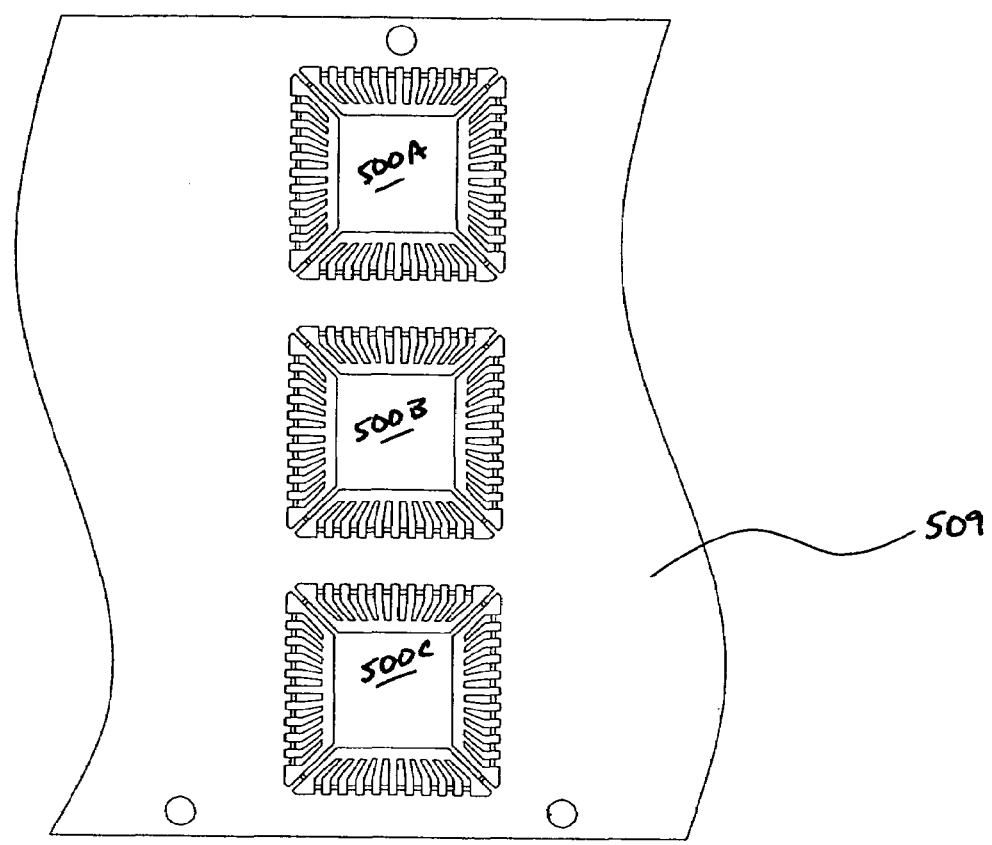
FIG. 5 is a plane view of a leadframe body according to an exemplary aspect of the present invention.

FIG. 2A illustrates a leadframe according to a first exemplary embodiment of the present invention. The leadframe 200 comprises an outer frame 209, a die pad portion 203 disposed within the outer frame, a plurality of lead portions 201, and a plurality of tie bars 206. The die pad portion 203 can be on the same plane as the outer frame portion 209, as shown in FIGS. 2A–2B, or it can be vertically offset from the outer frame so that it sits slightly above or slightly below the plane of the outer frame. The outer frame, or leadframe body, can support a single leadframe 200, as shown in FIGS. 2A–2B, or it can support a number of leadframes, as shown in FIG. 5. FIG. 5 illustrates a leadframe body 509, which supports three leadframes 500A–500C. A leadframe body such as illustrated in FIG. 5 could also support other numbers of leadframes, as would be understood by one of skill in the art.

As shown in FIG. 2A, the lead portions 201 extend substantially inward from the outer frame 209 towards the die pad portion 203. The tie bars 206 connect the die pad portion 203 to the outer frame 209. The tie bars 206 support the die pad portion 203 during the manufacture of an IC package, such as the package 600, illustrated in FIG. 6.

At least one of the lead portions 201 has a recess 204A formed therein. Preferably, but not necessarily, a majority of the lead portions have a recess formed therein. The recess, which is formed in the upper face of a lead portion 201 by a mechanical or chemical process can be formed in a number of shapes. The recess can be a channel formed through the upper surface of each of the lead portions 201 from one side to the opposite side thereof, as shown by recess 204A in FIG. 2A and recess 404A in FIG. 4A. The cross-section of a channel-shaped recess can be a number of different shapes, as illustrated in FIGS. 3A–3C. One possibility is that the channel recess can have a rectangular cross-section, such as recess 304A of FIG. 3A. Alternately, it can have a rounded cross-section, such as recess 304B of FIG. 3B, or a triangular cross-section, such as recess 304C of FIG. 3C. The cross-section of a channel-shaped recess can also take any other appropriate shape as would be understood by one of skill in the art.

Alternately, instead of having the form of a channel, the recess can be in the form of a dimple-shaped impression formed in the upper face of a lead portion 201, such as illustrated by recess 204B in FIG. 2B and by recesses 404B and 404C of FIGS. 4B–4C. A dimple-shaped recess does not necessarily reach the sides of the lead portion, as a channel-shaped recess does. The cross-section of a dimple-shaped recess can have a number of different shapes, as illustrated in FIGS. 3A–3C and described above, and as would be understood by one of skill in the art. Further, as viewed from above, the opening of a dimple-shaped recess can have a number of different shapes, such as a rounded shape, as illustrated in FIG. 4B, a rectangular shape, as illustrated in FIG. 4C, or any other shape as would be understood by one of skill in the art. The purpose of the recess, whether channeln-shaped, dimple-shaped, or otherwise, as would be understood by one of skill in the art, will be explained with reference to an IC package according to a second exemplary embodiment of the present invention.

According to an aspect of the first exemplary embodiment of the present invention, recesses can also be formed in the upper surface of at least one of the tie bars 206 of the leadframe 200. FIGS. 2A–2B illustrate such recesses 208A and 208B in tie bars 206. As described above with respect to the recesses formed in each of the lead portions 201, the recesses formed in each of the tie bars can be in the form of a channel, or a dimple-shaped impression, or otherwise, as would be understood by one of skill in the art, and can have any of a number of different cross-sections or openings, as would be understood by one of skill in the art.

According to the first exemplary embodiment, the above-mentioned elements of the leadframe 200 can be arranged, for example, as illustrated in FIGS. 2A–2B, or according to another arrangement, as would be understood by one of skill in the art. The leadframe 200 can be composed of a common copper alloy, such as C194, C7025, C151, or Eftec64T, for example.

Figure 6:
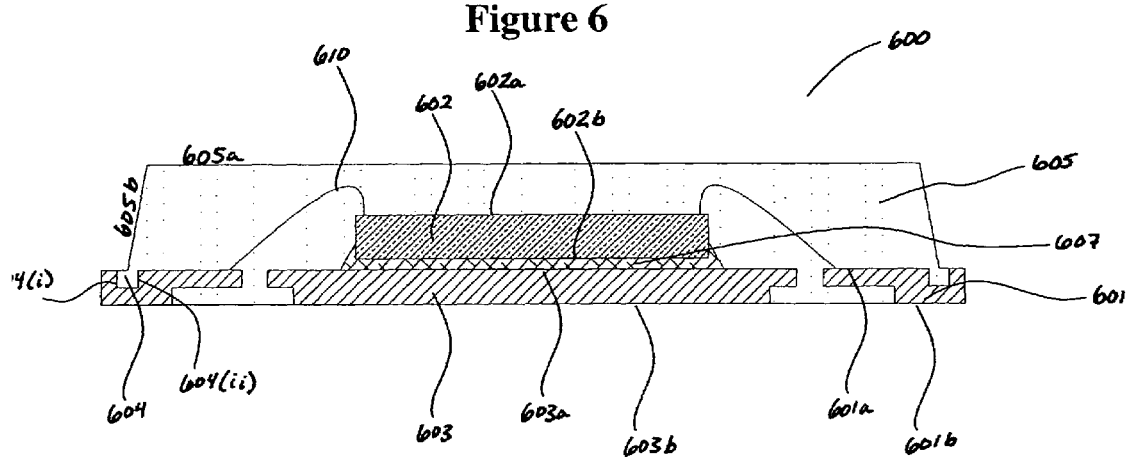
FIG. 6 is a cross-section of an IC package according to an exemplary embodiment of the present invention.

FIG. 6 illustrates an IC package 600 according to a second exemplary embodiment of the present invention. The package 600 comprises a lead frame, according to the first exemplary embodiment of the present invention, described above. The die pad 603 and the leads 601 of FIG. 6 correspond to the die pad portion and the lead portions described with respect to the first exemplary embodiment. The die pad 603 has a first face 603a and a second face 603b, opposite to the first face. Each of the plurality of leads 601 has a first face 601a and a second face 601b opposite to the first face. Due to their position in the leadframe, the leads 601 are disposed substantially around at least a portion of the die pad 603.

As described above, the first face 601a of at least one of the plurality of leads 601 has a recess formed therein. The recess can be in any of a number of forms, as described above with respect to the first exemplary embodiment, and as would be understood by one of skill in the art.

An adhesive layer 607 is disposed on the first face 603a of the die pad 603. The adhesive layer 607 can comprise, for example, electrically conductive or non-conductive epoxy, paste, or adhesive film, or the like, as would be understood by one of skill in the art. The package 600 also comprises an IC chip 602, having a first face 602a and a second face 602b, opposite to the first face 602a. The second face 602b of the IC chip 602 is coupled to the first face 603a of the die pad 603 through the adhesive layer 607. A plurality of wires 610 electrically conductively join the first face 602a of the IC chip 602, and components thereon, to the first face 601a of each of the plurality of leads 601. The wires 610 can be composed of gold, gold, with some level of impurities, aluminum, or copper, for example. For use in the wires 610, the gold can contain 1% impurities, which could include dopants or additives included to improve the properties of the wires, as would be understood by one of skill in the art.

The IC package 600 is enclosed by an encapsulant 605, which can be composed of a polymer-based molding compound or any other of many known encapsulant materials. The encapsulant encloses the IC chip 602, the plurality of wires 610, the adhesive layer 607, the leads 601, and the die pad 603, leaving the second faces 601a and 603a of the leads 601 and the die pad 603 free from encapsulant. The encapsulant forms a substantially planar upper surface 605a, which is substantially parallel to the first face 602a of the IC chip 602. The encapsulant 605 also forms a plurality of side walls 605b. The side walls 605b intersect the first faces 601a of each of the leads 601 within the inner walls of the recesses 604 formed therein. The side walls can slant outward from the upper surface 605a to the first faces 601a of each of the leads 601, as shown in FIG. 6, or may alternately form straight edges. Specifically, as shown by the recess 604 in FIG. 6 and by the recess 304A in FIG. 3A, the recess can be a channel or a dimple-shaped impression formed in the first face of a lead. the recess has a first and a second inner wall. With reference to FIG. 3A, recess 304A has a first inner wall 304A(i) and a second inner wall 304A(ii). The side 305b of the encapsulant 305 intersects with the lead 301A at a point 350 between the first inner wall 304A(i) and the second inner wall 304A(ii). The point 350 is not necessarily at the mid-point between the two inner walls of the recess 304A. Further, the encapsulant 305 fills the recess, as shown. Alternately, as illustrated in FIGS. 3B and 3C, and as discussed above, the cross-section of the recess may be rounded, triangular, or of another shape. In these cases, the side walls 305b of the encapsulant 305 will intersect the lead at a point between the inner edges of the recess, as shown in FIGS. 3B and 3C. This configuration of the recess and the encapsulant functions to lock the encapsulant to the lead, and thereby to the entire encapsulated package. This greatly decreases the chance that the encapsulant, once hardened, will separate from the leads when placed under stress. The encapsulant also serves to provide overall protection to the element is encloses and gives added strength to the package as a whole.

Hereinafter, the elements discussed with respect to the following embodiment and aspects are similar to those discussed with respect to the aforementioned embodiments and aspects, and may comprise the same exemplary materials, and constructions as discussed above.

FIGS. 7A–7E illustrate a method of assembling an IC package according to a third exemplary embodiment of the present invention. With reference, also, to FIG. 6, a method according to the third exemplary embodiment of the present invention comprises providing a die pad 603 having a first face 603a and a second face 603b and a plurality of leads 601, each having a first face 601a, and a second face 601b, opposite to the first face 601a. A recess 604, having inner walls, is formed in the first face of at least one of the leads 601. According to this method, the die pad 603 and the plurality of leads 601 can be provided for by a leadframe, such as the leadframe 200, shown in FIGS. 2A–2B, which also comprises a plurality of tie bars and an outer frame (not shown in FIG. 6). An IC chip 602 having a first face 602a and a second face 602b, opposite to the first face 602a, is also provided. The method also comprises coupling the second face 602b of the IC chip 602 to the first face 603a of the die pad 603, and electrically conductively joining the first face 602a of the IC chip 602 to the first faces 601a of the plurality of leads 601. The IC chip and the die pad can be coupled through an adhesive layer 607 or by another method as would be understood by one of skill in the art. The electric connecting of the IC chip to the leads can be done with thin wires, such as described above with reference to the second exemplary embodiment.

According to this method, the package is then encapsulated. As shown in FIG. 7D, a mold 720 is formed around the IC package and an encapsulant 605 can then be injected into the mold, thus surrounding the package. Once the mold 720 is removed, the encapsulant remains. Throughout this process, up until the encapsulant hardens, thus providing strength and support to the package, tie bars, such as those in FIGS. 2A–2B, support the die pad in the proper position. Similarly, the leads 601 are supported through their connection to an outer frame, such as shown in FIGS. 2A–2B. As described above, with respect to the second exemplary embodiment, the encapsulant forms a substantially planar upper surface 605a, which is substantially parallel to the first face 602a of the IC chip 602. The encapsulant also forms a plurality of sides 605b, at least one of which intersects the first face 601a of at least one of the leads 601 between the inner walls of the recess formed therein. Once the mold 720 is removed, the package can be cut with a typical mechanical cut tool 730, as shown in FIG. 7E, to form the package 600 as illustrated in FIG. 6.

Although the above exemplary embodiments of the present invention have been described, it will be understood by those skilled in the art that the present invention should not be limited to the described exemplary embodiments, but that various changes and modifications can be made within the spirit and scope of the present invention. Accordingly, the scope of the present invention is not limited to the described range of the following claims.

What is claimed is:

1. An integrated circuit package comprising:
   a die pad having a first face and a second face opposite to said first face;
   a plurality of leads each having a first face and a second face opposite to said first face, wherein
   said plurality of leads is disposed substantially around at least a portion of said die pad, and
   said first face of at least one of said plurality of leads has a recess formed therein, said recess having inner walls;
   an integrated circuit chip having a first face and a second face opposite to said first face wherein said second face is coupled to said first face of said die pad;
   a plurality of wires each linking said integrated circuit chip to one of said plurality of leads; and
   an encapsulant enclosing said integrated circuit chip, said plurality of wires, said first face of said die pad, and a portion of said first face of each of said plurality of leads, wherein said encapsulant forms a plurality of side walls, and at least one of said side walls intersects said first face of said at least one of said plurality of leads between the inner walls of said recess formed therein.

2. The integrated circuit package according to claim 1, wherein:
   a majority of said plurality of leads has a recess formed therein, said recess having inner walls; and
   said at least one of said plurality of side walls intersects said first face of said majority of said plurality of leads between the inner walls of said recess formed therein.

3. The integrated circuit package according to claim 1, wherein said recess comprises a channel formed through said lead.

4. The integrated circuit package according to claim 3, wherein said channel is formed from one side of the lead to the opposite side thereof.

5. The leadframe according to claim 1, wherein said recess comprises a dimpleshaped impression.

6. An integrated circuit package, comprising: a die pad;
a plurality of leads, each having a first face and a second face opposite to the first face, wherein at least on of said plurality of leads has a recess formed in said first face thereof, said recess having at least two inner walls;
an IC chip coupled to said die pad;
a plurality of wires connecting said integrated circuit chip to said plurality of leads; and
an encapsulant enclosing said integrated circuit chip, said plurality of wires, said dies pad, and a portion of at least one of said plurality of leads, wherein said encapsulant forms a plurality of side walls, at least one of which intersects said at least one lead between said inner walls of said recess formed therein, and wherein said encapsulant fills said recess.

\* \* \* \* \*